United States Patent [19]

Joseph et al.

[11] Patent Number: 5,360,979
[45] Date of Patent: Nov. 1, 1994

[54] FAST TURN-OFF CIRCUIT FOR SOLID-STATE RELAYS OR THE LIKE

[75] Inventors: Jerome J. Joseph, North Whitehall Township, Lehigh County; Michael F. Petras, Ruscombmanor Township, Berks County; Steven B. Witmer, Spring Township, Berks County, all of Pa.

[73] Assignee: AT&T Bell Laboratories, Murray Hill, N.J.

[21] Appl. No.: 102,431

[22] Filed: Aug. 5, 1993

[51] Int. Cl.⁵ .................. G02B 27/00; H03K 3/42
[52] U.S. Cl. ................... 250/551; 327/377; 327/514
[58] Field of Search ............ 250/214 R, 214 SW, 551; 307/311

[56] References Cited

U.S. PATENT DOCUMENTS

| | | | |
|---|---|---|---|
| 4,419,586 | 12/1983 | Phipps | 307/311 |
| 4,564,770 | 1/1986 | Sherman et al. | 250/551 |
| 4,864,126 | 9/1989 | Walters et al. | 250/551 |
| 4,902,901 | 2/1991 | Pernyeszi | 250/551 |
| 4,912,335 | 3/1990 | Ehalt et al. | 307/311 |
| 4,931,656 | 6/1990 | Ehalt et al. | 307/311 |
| 4,939,375 | 7/1990 | Walters et al. | 250/551 |
| 5,013,926 | 5/1990 | Aizawa | 250/551 |
| 5,138,177 | 8/1992 | Morgan et al. | 250/551 |
| 5,221,847 | 6/1993 | Ziemer | 250/551 |
| 5,278,422 | 1/1994 | Kato et al. | 250/551 |
| 5,298,817 | 3/1994 | Banak et al. | 307/311 |

Primary Examiner—David C. Nelms
Assistant Examiner—Stephone B. Allen
Attorney, Agent, or Firm—Scott W. McLellan

[57] ABSTRACT

A fast turn-off circuit for solid-state relays or the like. The relay has a photodiode array for controlling the conductivity of an output transistor. A JFET switch closes to discharge the gate of the output transistor when a photodiode array stops producing current. A bipolar transistor switch, upon detecting the JFET switch closure, discharges the photodiode array.

8 Claims, 1 Drawing Sheet

FAST TURN-OFF CIRCUIT FOR SOLID-STATE RELAYS OR THE LIKE

BACKGROUND OF THE INVENTION

1. Field of the Invention

This invention relates to solid-state relays generally and, more particularly, to the drive circuits therefore.

2. Description of the Prior Art

Solid-state relays are widely used in a variety of applications formally the domain of electromagnetic relays. However, the speed at which the solid-state relay operates may be too slow for some uses. Usually the turn-on time of the relay is adequate (approximately 100 µs or less) but the turn-off time can be an order of magnitude slower. An exemplary prior art form A (normally off) relay 1 is shown in FIG. 2.

The relay 1 uses series connected MOS transistors 2, 3 to selectively provide a conductive path between output terminals 4, 4'. Photodiode array (PDA) 6, when illuminated by LED array 7, provides the charge (voltage and current) necessary to drive transistors 2, 3 into conduction. Circuit arrangement 9 speeds discharge of the gates of transistors 2, 3 when the PDA 6 stops producing current. When the PDA 6 is producing current, the voltage drop across current sensing resistor 13 forces depletion mode JFET 14 to remain nearly non-conductive until the gates of transistors 2, 3 are fully charged. Then, in the steady-on state phase, the JFET 14 draws a small amount of current from the PDA 6. The resulting voltage drop across resistor 13 is approximately equal to the pinch-off voltage of the JFET 14, thereby leaving sufficient voltage on the gates of transistors 2, 3 to keep them on. When the PDA stops producing current, the voltage drop across resistor 13 decreases, allowing JFET 14 to conduct more heavily, thereby discharging the gates of transistors 2, 3.

While this arrangement allows for faster turn-off than just using a shunt resistor (not shown), it is not as fast as may be desired because as the JFET 14 conducts, charge remaining on the PDA 6 due to capacitance forces a voltage drop across the resistor 13, reducing the conductivity of the JFET 14.

Thus, it is desirable to provide a solid-state relay with faster turn-off time than previous relays.

It is a further desirable to provide a fast turn-off time relay without significantly impacting the turn-on time of the relay or external characteristics of the relay (e.g., LED 7 current) and without complex circuitry.

SUMMARY OF THE INVENTION

These and other aspects of the invention may be obtained generally in a solid suite relay having: a control signal generator; at least one output transistor having an input terminal and two output terminals, the output terminals coupling to the output of the relay, the input terminal coupling to the control signal generator; and a first switch for shunting the input terminal of the output transistor to a first one of the two output terminals of the output transistor upon substantial removal of the control signal, thereby discharging the input terminal. The relay is characterized by: a second switch, responsive to the first switch, for discharging the control signal generator while the first switch discharges the input terminal of the output transistor. The control signal determines whether the relay is conducting or non-conducting.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
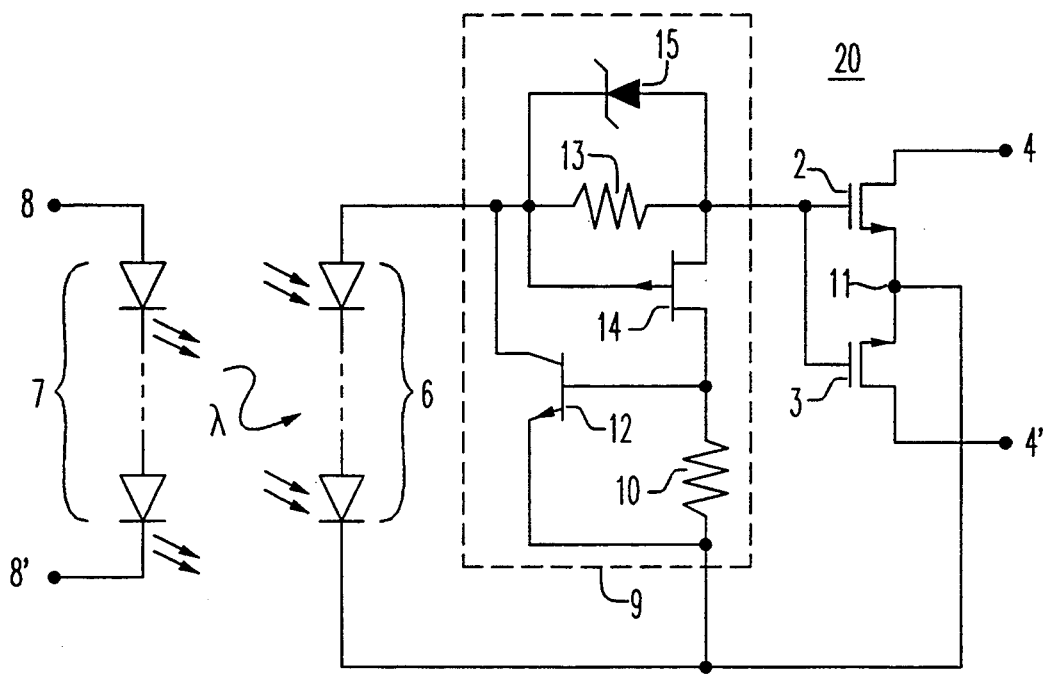
FIG. 1 is a simplified schematic diagram of the preferred embodiment of the invention.

The invention may be referred to generally in a solid state relay 20 having: a control signal generator 6; at least one output transistor 2, 3 having an input terminal and two output terminals, the output terminals coupling to the relay 20 output 4, 4', the input terminal coupling to the control signal generator 6; and a first switch 14 for shunting the input terminal of the output transistor 2, 3 to a first one of the two output terminals 11 of the output transistor upon substantial removal of the control signal, thereby discharging the input terminal. The relay 20 is characterized by: a second switch 12, responsive to the first switch 14, for discharging the control signal generator 6 while the first switch 14 discharges the input terminal of the output transistor 2, 3. The control signal determines whether the relay is conducting or non-conducting.

Figure 2:
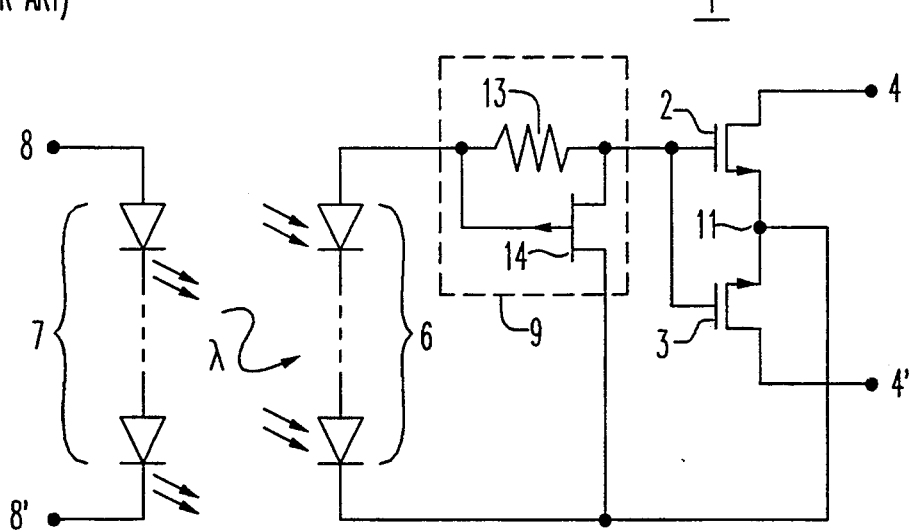
FIG. 2 is a simplified schematic diagram of a prior art solid-state relay.

In more detail, the relay 20 is similar to the prior art relay 1 of FIG. 2: it has output transistors 2, 3 coupled to the output terminals 4, 4' of the relay 20; and a PDA 6 illuminated by LED array 7 coupled to the input terminals 8, 8' of the relay 20. Circuit arrangement 9 includes an additional transistor 12 which assists in discharging the PDA 6 when the transistor 14 discharges the gates of transistors 2, 3, as will be discussed below.

Operation of the relay 20 is similar to the relay 1 of FIG. 1, discussed above.

To aid in turn-on of the relay 20, Zener diode 20 may be added to limit the voltage across resistor 13 during charge-up of the gates of transistors 2, 3. This additionally protects JFET 14 from gate-to-source break-down if the voltage across resistor 13 becomes too high.

During turn-off of the relay 20, tile PDA 6 stops producing current and the transistor 14 begins to conduct more heavily to discharge the gates of transistors 2, 3 to the common source terminal 11. As noted above, when transistor 14 conducts, residual charge in the PDA 6 causes tile resistor 13 to drop a voltage which reduces the conductivity of JFET 14, slowing the discharge of the transistors 2,3.

Added to circuit 9 is a sense resistor 10 and a bipolar shunt transistor 12 to discharge the PDA 6 when the JFET 14 is discharging the gates of transistors 2, 3. Resistor 10 "senses" when the JFET 14 is carrying sufficient current, indicative of the transistors 2, 3 being discharged thereby. If sufficient current is passing, then transistor 12 is turned on to discharge the PDA 6 by a path separate from the combination of resistor 13 and JFET 14. This allows for a smaller voltage drop across resistor 13 and, thus, higher conduction by JFET 14. The result is a faster discharge of both the transistors 2, 3 and the PDA 6, speeding the turn-off of the relay 20.

Selection of the resistance values of resistors 10, 13 and the threshold voltage of JFET 14 are important to reduce the impact of transistor 12 on the turn-on of the relay 20. Degradation of the turn-on characteristics of the relay 20 occur when the collector current of transistor 12 become significant during the turn-on and steady-on state phases of the relay 20 operation. The main impact of a significant collector current during these phases is the need for greater PDA 6 current for the same turn-on time, which generally means the minimum LED 7 current must be increased. This is undesirable in many circumstances.

The resistance of resistor 13 and the pinch-off voltage of JFET 14 are chosen such that, for a minimum illumination of the PDA 6, the current through the resistor 13 is small enough to prevent the PDA 6 output voltage from dropping below that needed to keep the transistors 2, 3 fully on during the steady-on state. That current is substantially equal to $$\frac{V_p}{R_{13}},$$

where $V_p$ is the pinch-off voltage of JFET 14 and $R_{13}$ is the resistance of resistor 13.

The collector current of transistor 12 should be limited to a level that does not divert too much PDA 6 current from charging the gates of transistors 2, 3 and from JFET 14. It has been found that the collector current should be about 5% of the JFET 14 current in the relay steady-on state. To approximately set the collector current of transistor 12, the resistance of resistor 10 should be less than or equal to:

$$\frac{R_{13} V_T}{V_p} \ln\left(\frac{V_p \, 0.01 \, X}{I_s R_{13}}\right)$$

where $V_T$ is the thermal voltage (kT), $I_s$ is the saturation current of the transistor 12 (approximately $10^{-15}$ A) and X is the percentage of the JFET 14 current in the collector of transistor 12.

However, the higher the ratio of the resistances of resistor 13 to resistor 10, the faster the turn-off time of the relay 20 will be, limited by the above criteria.

EXAMPLE

A solid-state relay 20 has been formed in a common integrated circuit using the below exemplary component values to achieve a turn-on time of 120 μs and a turn-off time of about 20 μs:

| Resistor 10 | 3.2 MΩ |
| Resistor 13 | 14.5 MΩ |
| $V_p$ | 2 volts |
| PDA 6 | 1 μA minimum, 15 volts maximum |

It is understood that other circuit topologies embodying the invention may be created, including reversing the polarity of the transistors diode, and the PDA 6. It is also conceivable that the transistor 12 can be replaced by an enhancement mode FET and the transistor 14 replaced with a bipolar transistor.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. A solid state relay having:
   a control signal generator;
   at least one output transistor having an input terminal and two output terminals, the output terminals coupling to the output of the relay, the input terminal coupling to the control signal generator;
   a first switch for shunting the input terminal of the output transistor to a first one of the two output terminals of the output transistor upon substantial removal of the control signal, thereby discharging the input terminal;
   characterized by:
   a second switch, responsive to the first switch, for discharging the control signal generator while the first switch discharges the input terminal of the output transistor;
   wherein the control signal determines whether the relay is conducting or non-conducting.

2. The relay as recited in claim 1, wherein the second switch is further characterized by:
   a first current sensing device disposed in series with the first switch:
   a first transistor, responsive to the first current sensing device and coupling to the generator, for shunting the generator when the current exceeds a predetermined amount.

3. The relay as recited in claim 2, wherein the first switch includes:
   a second current sensing device for detecting the control signal current from the generator to the input terminal of the output transistor;
   a second transistor for shunting the input terminal to the first one of the output terminals of the output transistor when the second current sensing device detects control signal current is less than a predetermined amount.

4. The relay as recited in claim 3, wherein the current sensing devices are resistors, the first transistor is a bipolar transistor, the second transistor is a JFET, and the generator is a photodiode array.

5. A solid state relay having:
   a control signal generator with two outputs;
   at least one output transistor having an input terminal and two output terminals, the output terminals coupling to the output of the relay, the input terminal coupling to the control signal generator;
   a first switch for shunting the input terminal of the output transistor to a first one of the two output terminals of the output transistor upon substantial removal of the control signal, thereby discharging the input terminal;
   characterized by:
   a second switch disposed across tile output terminals of the generator and responsive to the first switch, for shunting the control signal generator while the first switch discharges the input terminal of the output transistor;
   wherein the control signal determines whether the relay is conducting or non-conducting.

6. The relay as recited in claim 5, wherein the second switch is further characterized by:
   a first resistor disposed in series with the first switch;
   a first transistor, responsive to the first current sensing device and having two outputs coupling to the outputs of the generator, for shunting the generator when the current in the first resistor exceeds a predetermined amount.

7. The relay as recited in claim 6, wherein the first switch includes:
   a second resistor disposed in series between the generator and the input terminal of the output transistor for detecting the control signal current;
   a second transistor for shunting the input terminal to the first one of the output terminals of the output transistor when the control signal current is less than a predetermined amount.

8. The relay as recited in claim 7, wherein the generator is a photodiode array, the first transistor is a bipolar transistor, the second transistor is a JFET.

* * * * *